United States Patent
Horan et al.

(10) Patent No.: US 12,199,586 B2
(45) Date of Patent: Jan. 14, 2025

(54) CAPACITIVE ISOLATOR HAVING COMMON MODE NOISE SUPPRESSION

(71) Applicant: Allegro MicroSystems, LLC, Manchester, NH (US)

(72) Inventors: John Horan, Cork (IE); Guillaume Aulagnier, Cannes (FR)

(73) Assignee: Allegro MicroSystems, LLC, Manchester, NH (US)

( * ) Notice: Subject to any disclaimer, the term of this patent is extended or adjusted under 35 U.S.C. 154(b) by 104 days.

(21) Appl. No.: 18/192,932

(22) Filed: Mar. 30, 2023

(65) Prior Publication Data

US 2024/0333247 A1 Oct. 3, 2024

(51) Int. Cl.
*H03H 7/42* (2006.01)
*H03H 7/01* (2006.01)
*H03K 17/16* (2006.01)

(52) U.S. Cl.
CPC .......... *H03H 7/427* (2013.01); *H03H 7/0138* (2013.01); *H03K 17/162* (2013.01)

(58) Field of Classification Search
CPC ..... H03H 7/427; H03H 7/0138; H03K 17/162
See application file for complete search history.

(56) References Cited

U.S. PATENT DOCUMENTS

| | | | |
|---|---|---|---|
| 4,748,419 A | 5/1988 | Somerville | |
| 7,732,889 B2 | 6/2010 | Crawley et al. | |
| 8,736,343 B2 | 5/2014 | Chen et al. | |
| 8,786,279 B2 | 7/2014 | Petrie | |
| 9,473,163 B1 | 10/2016 | Tsai | |
| 9,514,788 B1 | 12/2016 | Kim | |
| 9,998,301 B2 | 6/2018 | Yun et al. | |
| 10,074,713 B1 | 9/2018 | Briano | |
| 10,074,939 B1 | 9/2018 | Briano | |
| 10,236,878 B1 | 3/2019 | Chen et al. | |
| 10,236,932 B1 | 3/2019 | Briano | |
| 10,659,173 B1 | 5/2020 | Li et al. | |
| 10,705,560 B1 | 7/2020 | Petrie | |
| 10,985,720 B2 | 4/2021 | Drinovsky et al. | |
| 11,029,366 B2 | 6/2021 | Briano | |
| 11,115,244 B2 | 9/2021 | Briano et al. | |
| 11,146,341 B1 * | 10/2021 | Nuebling ................. | H04B 1/40 |

(Continued)

OTHER PUBLICATIONS

Response to U.S. Non-Final Office Action dated Sep. 16, 2024 for U.S. Appl. No. 17/653,487; Response filed Oct. 10, 2024; 7 Pages.

(Continued)

*Primary Examiner* — Sibin Chen

(74) *Attorney, Agent, or Firm* — DALY, CROWLEY, MOFFORD & DURKEE, LLP

(57) ABSTRACT

Methods and apparatus for capacitively isolated first communication channels with common mode noise suppression. In embodiments, a driver on the first circuit transmits a data signal on the first communication channel to a receiver on the second circuit. A common mode suppression circuit on the second circuit is coupled to the receiver, output of the suppression circuit is coupled to a node between the first capacitor and the resistor network and an input is coupled to a ground of the first circuit via a second capacitor. The common mode suppression circuit is configured to detect a common mode movement signal due to a noise pulse to the second circuit on the input and generate a corresponding signal on the output to maintain a current level across the resistor network for suppressing common mode noise from the pulse.

12 Claims, 7 Drawing Sheets

(56) References Cited

U.S. PATENT DOCUMENTS

| | | | |
|---|---|---|---|
| 11,228,466 B2 | 1/2022 | Petrie et al. | |
| 11,272,591 B1 | 3/2022 | Lee | |
| 11,289,406 B2 | 3/2022 | Briano et al. | |
| 11,303,257 B2 | 4/2022 | Daubert et al. | |
| 11,342,288 B2 | 5/2022 | Briano et al. | |
| 11,515,246 B2 | 11/2022 | Chetlur et al. | |
| 2014/0354357 A1* | 12/2014 | Shrestha | H04L 25/0292 330/252 |
| 2016/0119030 A1* | 4/2016 | Shrestha | H04L 25/0266 375/256 |
| 2016/0341780 A1* | 11/2016 | McLeod | G01R 31/67 |
| 2018/0131341 A1 | 5/2018 | Nallamothu | |
| 2020/0014463 A1 | 1/2020 | Tanaka | |
| 2021/0057330 A1 | 2/2021 | Briano et al. | |
| 2023/0084169 A1 | 3/2023 | Chetlur et al. | |

OTHER PUBLICATIONS

U.S. Appl. No. 17/653,487, filed Mar. 4, 2022, Uberti et al.
Daughton, "Spin-Dependent Sensors;" Invited Paper; Proceedings of the IEEE, vol. 91, No. 5; May 2003; 6 Pages.
Kanekawa, et al.; "An Analog Front-End LSI with On-Chip Isolator for V.90 56kbps Modems"; 2000 Custom Integrated Circuits Conference; pp. 327-330; May 2000; 4 Pages.
U.S. Non-Final Office Action dated Jun. 3, 2021 for U.S. Appl. No. 16/526,081; 14 Pages.
Response to U.S. Non-Final Office Action dated Jun. 3, 2021 for U.S. Appl. No. 16/526,081; Response filed Jun. 21, 2021; 15 Pages.
U.S. Final Office Action dated Sep. 29, 2021 for U.S. Appl. No. 16/526,081; 15 Pages.
Response to U.S. Final Office Action dated Sep. 29, 2021 for U.S. Appl. No. 16/526,081; Response filed Oct. 28, 2021; 14 Pages.
U.S. Notice of Allowance dated Nov. 29, 2021 for U.S. Appl. No. 16/526,081; 11 Pages.
PCT International Search Report and Written Opinion dated May 16, 2023 for International Application No. PCT/US2023/061711; 13 Pages.
U.S. Non-Final Office Action dated Sep. 16, 2024 for U.S. Appl. No. 17/653,487; 7 Pages.
Sumathi et al., "Performance and Analysis of CML Logic Gates and Latches;" Conference Paper from 2007 International Symposium on Microwave, Antenna, Propagation and EMC Technologies for Wireless Communications; Aug. 16, 2007; 4 Pages.

* cited by examiner

CAPACITIVE ISOLATOR HAVING COMMON MODE NOISE SUPPRESSION

BACKGROUND

As is known in the art, signal isolator devices are useful for transmitting and receiving data signals between isolated systems, such as systems that operate in different voltage domains. Isolators provide data transmission across an isolation barrier while maintaining galvanic isolation of the systems. Known isolator devices are often differentially-driven. Data signals may move differentially about a common mode signal. Isolator devices may be useful in noisy environments in which electro-magnetic transients may cause signal corruption. Some transients cause deviation in the common mode of the signals being transmitted by the system. Thus, where a differential signal pair ideally would deviate from the common mode in differential fashion, a common mode transient may cause the differential signals to vary together in a manner that interferes with operation of the isolator.

SUMMARY

Example embodiments provide methods and apparatus for an isolator having protection against common mode current flow across an isolation barrier using a suppression circuit, such as a filter, on one side of the signal path. In embodiments, an isolator system includes a differential capacitive communications channel that rejects common mode voltage movement by measuring the amount of capacitor displacement current caused by the common mode voltage movement. The detected signal is injected into one or more signal carrying capacitors to cancel the normally detrimental displacement current simultaneously occurring in these capacitors. In some embodiments, detection and/or injection is achieved with a current mirror circuit.

In one aspect, a system comprises: a capacitively isolated first communication channel connecting first and second systems via a first capacitor; a driver on the first system to transmit a data signal on the first communication channel to a receiver on the second system, wherein the receiver comprises a resistor network coupled between a ground for the second system and the first capacitor; and a common mode suppression circuit on the second system coupled to the receiver, the common mode suppression circuit having an input and an output, wherein the output is coupled to a node between the first capacitor and the resistor network and the input is coupled to a ground of the first system via a second capacitor, wherein the common mode suppression circuit is configured to detect on the input a common mode movement signal due to a noise pulse to the second system and generate on the output a corresponding signal to maintain a current level to the resistor network and suppress common mode movement in the second circuit in response to the noise pulse.

A system can further include one or more of the following features: the first and second capacitors have matching capacitance, the common mode suppression circuit comprises a current mirror circuit, the current mirror circuit comprises MOSFET transistors, the current mirror comprises N-channel devices, the current mirror comprises P-channel devices, the first communication channel comprises a differential channel and the driver comprises complementary driver devices, a second communication channel, wherein the first and second communication channels provide bidirectional communication, the common mode suppression circuit comprises matched transistors coupled in a current mirror configuration, and/or the common mode suppression circuit comprises transistors trimmed to compensate for mismatch in respective impedances of the first and second capacitors.

In another aspect, a system comprises: a capacitively isolated differential first communication channel connecting first and second circuits via first and second capacitors; a first driver to transmit a positive data signal of a differential signal and a second driver to transmit a negative data signal of the differential signal from the first circuit on the first communication channel to a receiver on the second circuit via the first and second capacitors, wherein the first driver has a first path to ground via a third capacitor and the second driver has a second path to ground via a fourth capacitor, wherein the receiver comprises a resistor network having a first terminal coupled to the first capacitor and a second terminal coupled to the second capacitor; and a common mode suppression circuit on the second circuit, wherein the common mode suppression circuit comprises first and second current mirrors coupled to the first and second drivers, wherein the common mode suppression circuit is configured to detect a common mode movement signal due to a noise pulse to the second circuit on the input and generate a corresponding signal on the output to maintain a current level across the resistor network and suppress common mode movement in the second circuit in response to the noise pulse.

A system can further include one or more of the following features: the first current mirror comprises p-channel devices and the second current mirror comprises n-channel devices, the first current mirror is configured to mirror current through the third capacitor, the second current mirror is configured to mirror current through the fourth capacitor, the first and second current mirrors are configured to maintain current in the resistor network in response to common mode noise in the second circuit, and/or the first current mirror is coupled to the third capacitor, the first driver, the second driver, the second current mirror, and the resistor network.

In another aspect, a method comprises: employing a capacitively isolated first communication channel connecting first and second systems via a first capacitor; employing a driver on the first system to transmit a data signal on the first communication channel to a receiver on the second system, wherein the receiver comprises a resistor network coupled between a ground for the second system and the first capacitor; and employing a common mode suppression circuit on the second system coupled to the receiver, the common mode suppression circuit having an input and an output, wherein the output is coupled to a node between the first capacitor and the resistor network and the input is coupled to a ground of the first system via a second capacitor, wherein the common mode suppression circuit is configured to detect on the input a common mode movement signal due to a noise pulse to the second system and generate on the output a corresponding signal to maintain a current level to the resistor network and suppress common mode movement in the second circuit in response to the noise pulse.

A method can further include one or more of the following features: the first and second capacitors have matching capacitance, the common mode suppression circuit comprises a current mirror circuit, the current mirror circuit comprises MOSFET transistors, the current mirror comprises N-channel devices, the current mirror comprises P-channel devices, the first communication channel comprises a differential channel and the driver comprises complementary driver devices, a second communication channel, wherein the first and second communication channels provide bidirectional communication, the common mode suppression circuit comprises matched transistors coupled in a current mirror configuration, and/or the common mode suppression circuit comprises transistors trimmed to compensate for mismatch in respective impedances of the first and second capacitors.

In another aspect, a method comprises: employing a capacitively isolated differential first communication channel connecting first and second circuits via first and second capacitors; employing a first driver to transmit a positive data signal of a differential signal and a second driver to transmit a negative data signal of the differential signal from the first circuit on the first communication channel to a receiver on the second circuit via the first and second capacitors, wherein the first driver has a first path to ground via a third capacitor and the second driver has a second path to ground via a fourth capacitor, wherein the receiver comprises a resistor network having a first terminal coupled to the first capacitor and a second terminal coupled to the second capacitor; and employing a common mode suppression circuit on the second circuit, wherein the common mode suppression circuit comprises first and second current mirrors coupled to the first and second drivers, wherein the common mode suppression circuit is configured to detect a common mode movement signal due to a noise pulse to the second circuit on the input and generate a corresponding signal on the output to maintain a current level across the resistor network and suppress common mode movement in the second circuit in response to the noise pulse.

A method can further include one of more of the following features: the first current mirror comprises p-channel devices and the second current mirror comprises n-channel devices, the first current mirror is configured to mirror current through the third capacitor, the second current mirror is configured to mirror current through the fourth capacitor, the first and second current mirrors are configured to maintain current in the resistor network in response to common mode noise in the second circuit, and/or the first current mirror is coupled to the third capacitor, the first driver, the second driver, the second current mirror, and the resistor network.

BRIEF DESCRIPTION OF THE DRAWINGS

The foregoing features of this invention, as well as the invention itself, may be more fully understood from the following description of the drawings in which.

DETAILED DESCRIPTION

Figure 1:
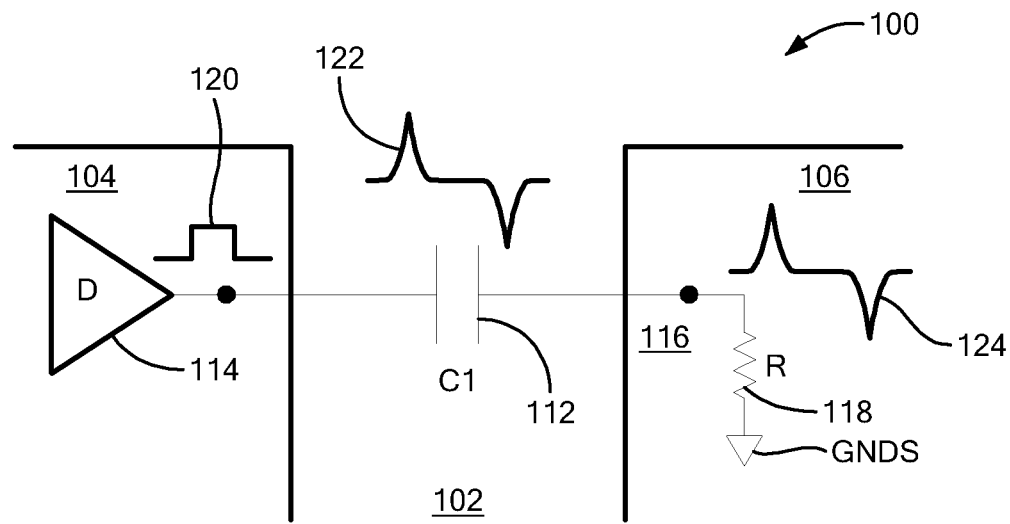
FIG. 1 is a schematic representation of a system having a capacitively isolated communication channel to transmit data.

FIG. 1 shows a system 100 having a capacitively isolated communication channel 102 between a first circuit 104, and a second circuit 106. In the illustrated embodiment, the first and second circuits 104, 106 have different voltage domains on different die which require the isolated communication channel 102 to exchange data. In the illustrated embodiment, the communication channel 102 includes a first capacitor 112 (C1) coupled between a driver 114 on the first circuit 104 and a receiver 116 on the second circuit 106. In an example embodiment, the receiver 116 includes a resistor 118 (R) coupled to ground GNDS for the second circuit.

The driver 114 outputs a voltage waveform 120, such as a digital pulse, to the first capacitor 112 (C1), which provides the isolation barrier between the first and second systems 104, 106. A current waveform 122 is produced in response to the voltage waveform 120. The current 122 flows into the resistor 118 on the second circuit 106 and creates a voltage waveform 124.

Figure 2:
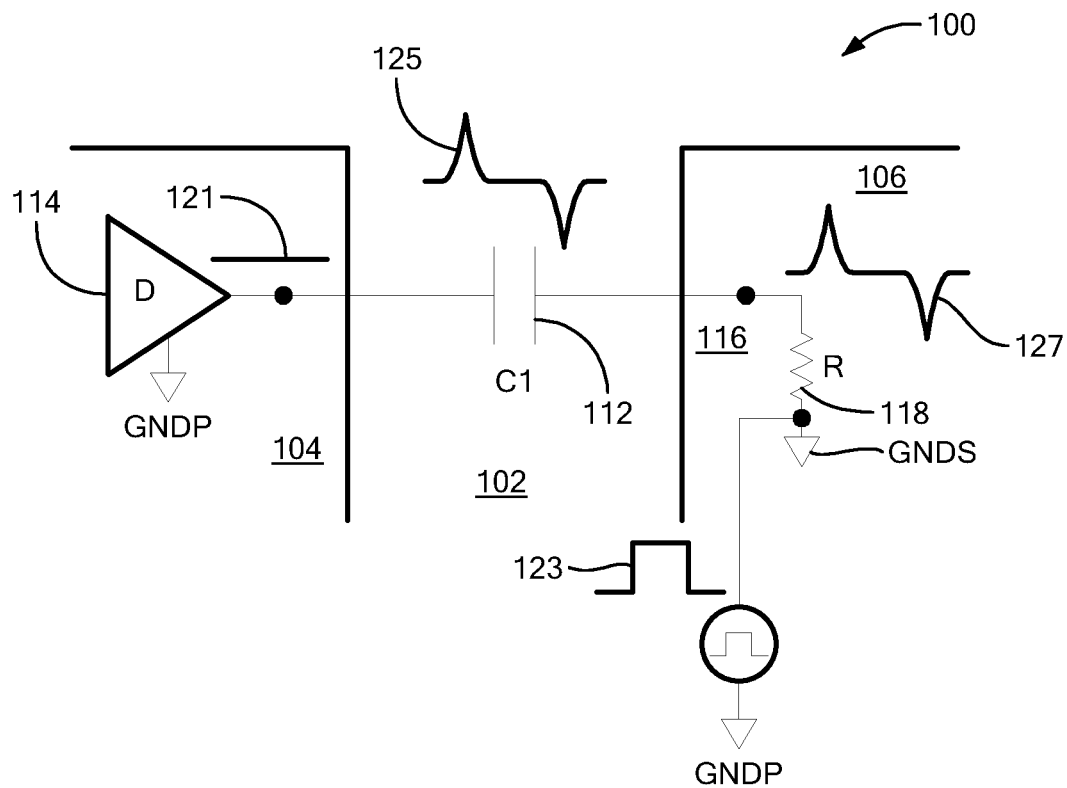
FIG. 2 is a schematic representation of the system of FIG. 1 with common mode noise present.

FIG. 2 shows the system of FIG. 1 except the driver 114 is no longer actively sending data 121, and the primary ground GNDP on the second circuit 106 is now being pulsed 123 causing common mode movement. The resistor 118 is coupled to local or secondary ground GNDS on the second circuit 106. This pulsing may be normal for a high side driver circuit in noisy environments and the pulses can result in voltages changing at rates in the order of 200V/nS. As a result of the pulse 123 to the ground GNDP, the first capacitor 112 experiences a current waveform 125 similar to the data pulse in FIG. 1. This current from the pulse 123 flows into the resistor 118 and creates a voltage waveform 127 similar to voltage waveform 124 in FIG. 1 corresponding to the data pulse on the communication channel. The pulse 123 creates common mode movement in the form of the current signal 125 due to rate of change of the potential difference between the driver 114, which is coupled to ground GNDP, and the secondary ground GNDS of the receiver 116 on the second circuit 106.

In example applications, the second system 106 may comprise a motor controller for driving motor phases with signals that may be in the order of 600V, for example, with a frequency in the hundreds of kHz. The first and second systems can form part of a motor controller IC package for controlling three-phase motors. The second system 106 may be subject to common mode movements of 600V over 2 ns. Currents generated as capacitors charge/discharge may be computed as capacitance C times the rate of change in voltage V, i.e., $i=C(\Delta V/\Delta t)$. Data signals over a communication channel between systems may comprise digital signals with pulses in the order of 0 to 3V. It is desirable to make the digital communication channel impervious to common mode movement on the second system, for example. It is understood that the first and second systems can comprise a wide range of devices, such as motor drivers, rectifiers, half and full bridge circuits, inverters, DC-DC converters, and the like.

Thus, it can be seen that the signal (124 or 127) across the resistor 118 may be the result of a data pulse 120 (FIG. 1) from the driver 114 or pulsing 123 associated with common mode movement experienced by the high side circuit 106.

Thus, it is desirable to extract the data signal provided by the driver in the presence of the noise induced by the common mode movement.

Figure 3:
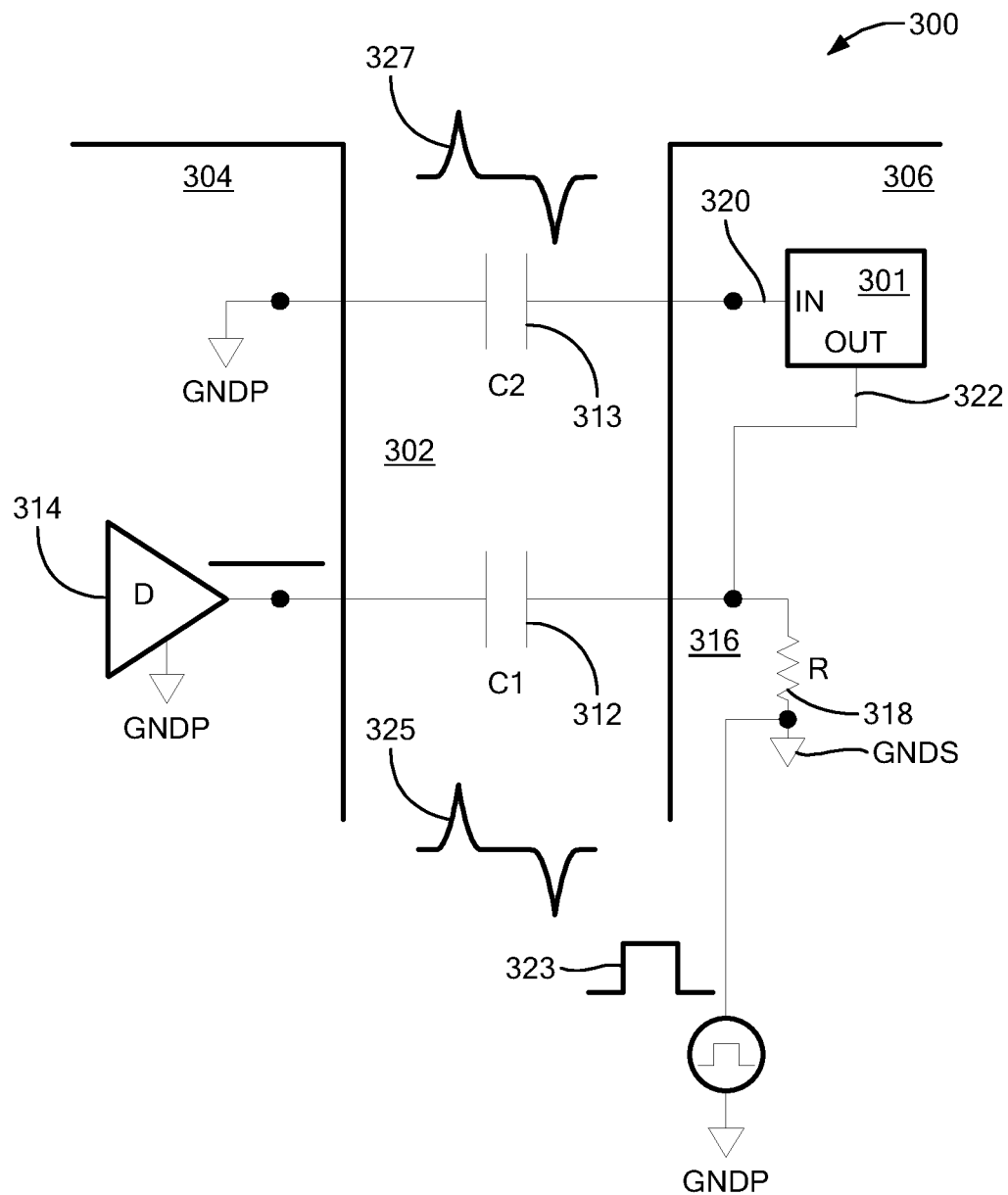
FIG. 3 is a schematic representation of a system having a capacitively isolated communication channel having common mode noise suppression.

FIG. 3 shows an example system 300 that has some commonality with the systems of FIGS. 1 and 2 with the addition of a second capacitor 313 (C2) coupled between the first circuit 304 and a suppression module 301 on the second circuit 306. A driver 314 on the first circuit 304 is connected to a receiver 316 on the second circuit 306 via a communication channel 302. The receiver 316 includes a resistor 318 connected to a secondary ground GNDS of the second circuit 306. The second circuit 306 may be susceptible to pulses 323 on primary ground GNDP.

In the illustrated embodiment, the suppression module 301 has an input 320 coupled to primary ground GNDP on the first circuit 304 via the second capacitor 313 and an output 322 coupled to a node between the first capacitor 312 (C1) and the resistor 318. The suppression module 301 is referenced to the potential of GNDS.

In the illustrated embodiment, the first capacitor 312 has no data stimulus as the driver 314 is not transmitting pulses. Current flow 325 across the first capacitor 312 is caused by common mode movement in the second (high side) circuit 306 due to common mode pulse(s) 323. The suppression circuit 301 measures the current flow 327 which arrives on the input port 320 and returns the same level of current on the output port 322. If the first and second capacitors C1, C2 have equal capacitance, the current flow through the first and second capacitors 312, 313 will be the same. If the suppression circuit 301 sends back the same current on the output port 322 that was taken from the input port 320 then current from the output port will exactly supply the common mode movement current in the first capacitor 312. That is, the net current change into the resistor is zero and thus the suppression circuit 301 effectively cancels the current generated by the common mode voltage change. Because none of the common mode movement current induced in the first capacitor 312 passes through the resistor 318 the voltage across the resistor 318 is not impacted by the common mode voltage movement. The current created in the first capacitor 312 as a result of the data driver 314 is not affected by the suppression circuit 301 and thus the resulting data signal is not affected.

Figure 4:
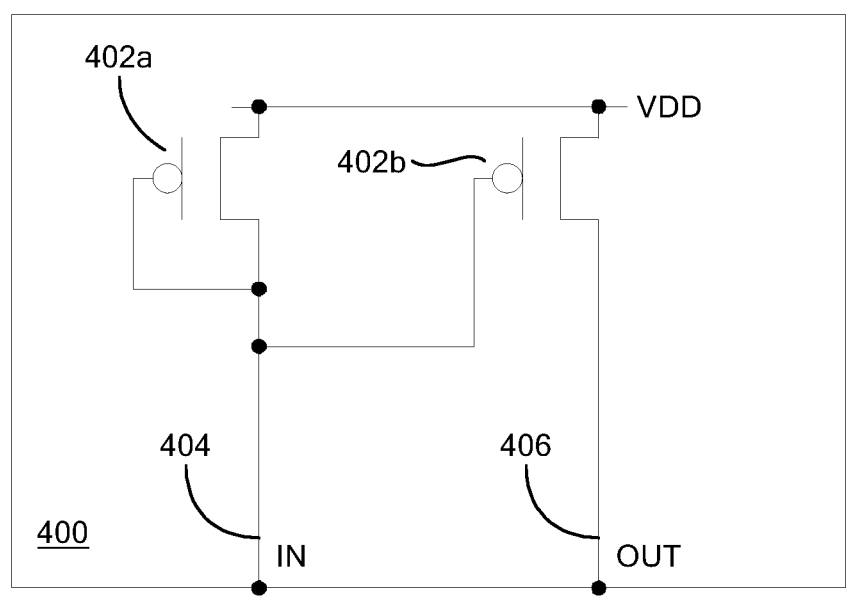
FIG. 4 is a circuit diagram of an example common mode noise suppression circuit.

FIG. 4 shows an example embodiment of a suppression circuit 400, such as the suppression circuit 301 of FIG. 3, having a current mirror formed with first and second PMOS transistors 402a,b. The first transistor 402a corresponds to an input port 404 of the suppression circuit and second transistor 402b corresponds to an output port 406 so that current being pulled from the input is supplied back out through the output. As will be readily appreciated, and described above, a signal on the input 404 is mirrored on the output 406 of the current mirror. With this arrangement, the current mirror 400 supplies the first capacitor 312 (FIG. 3) with the common mode movement current induced in the second capacitor 313 and thus, zero voltage across the resistor 318 as a result of common mode voltage movement in the first circuit 306. The illustrated suppression circuit 400 can provide a very fast response, e.g., in the order of tens or hundreds of picoseconds.

It is understood that any configuration of suitable technology devices, such as diodes and/or transistors, can be used to from a current mirror. In addition, a variety of circuits can be used to detect an input current and generate a proportional output current for common mode movement suppression.

Figure 5:
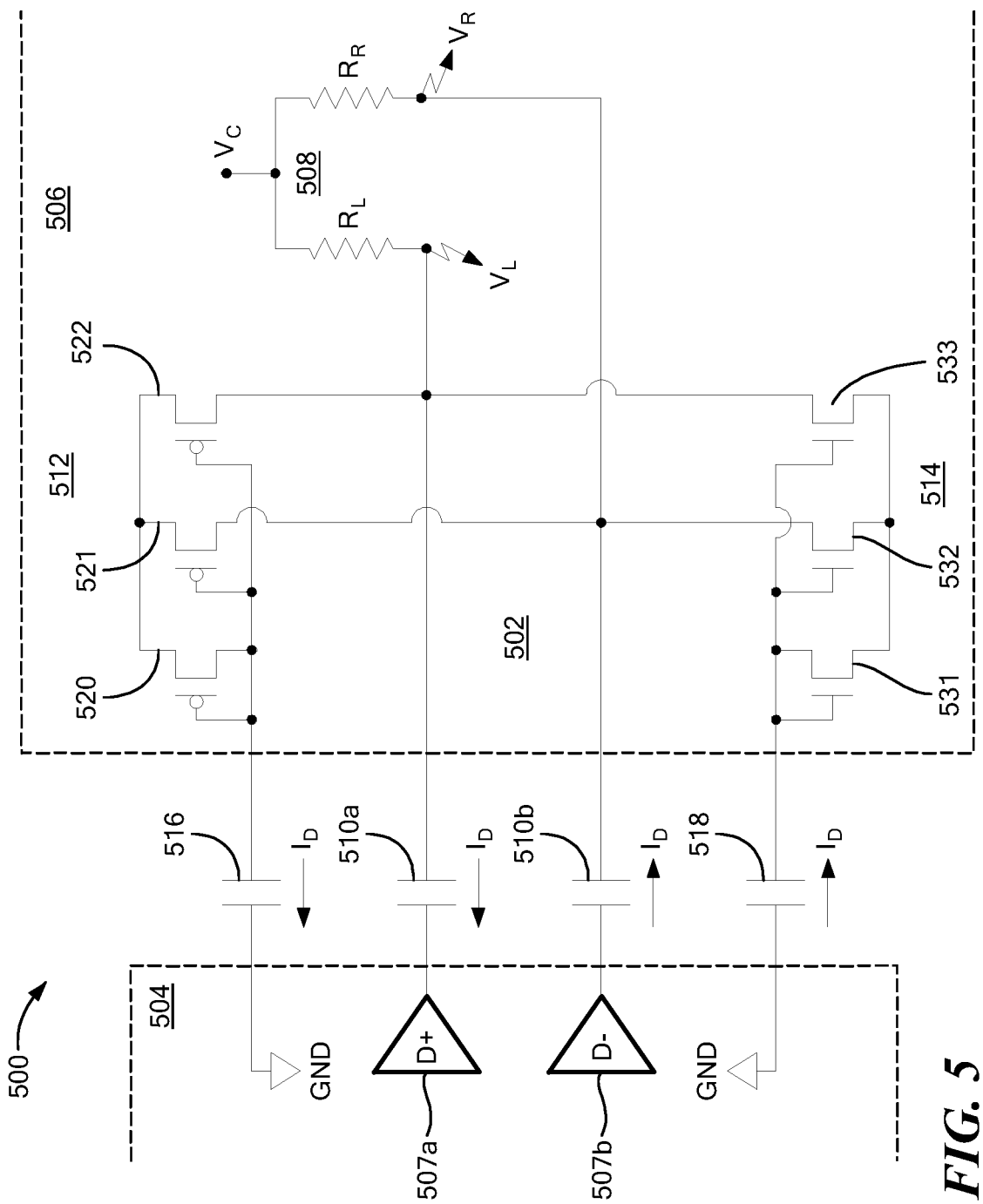
FIG. 5 is a schematic representation of a system having a differential capacitively isolated communication channel having common mode noise suppression.

FIG. 5 shows an example embodiment of common mode signal suppression in a differential configuration with MOSFET current mirrors in place to negate the impact of the common mode current noise. The data signal is sent across the communication channel using drivers D+ and D− with the input to these drivers being the Boolean NOT of each other. This results in an enhanced differential signal across the differential resistors RL and RR, across which a differential voltage VL-VR appears.

The differential system 500 includes a communication channel 502 connecting first and second systems 504, 506 with common mode noise suppression. A differential driver 507 on the first system 504 includes a positive driver 507a and a negative driver 507b each referenced to ground GND and coupled to a receiver 508 of the second system 506 via respective driver coupling capacitors 510a,b. In the illustrated embodiment, the receiver 508 comprises a resistor divider network that includes resistors RL and RR and is coupled to the drivers 507a,b to generate differential voltages VL, VR.

A first suppression module 512 is coupled between ground and the first driver 507a output and a second suppression module 514 is coupled between ground and the second driver 507b output via respective coupling capacitors 516, 518. In the illustrated embodiment, the first and second suppression modules 512, 514 comprises MOSFET transistor-based current mirrors.

In the illustrated embodiment, voltage on the high side circuit 506 is ramping positively, which creates displacement currents ID in the coupling capacitors 510a,b, 516, 518. If the capacitors are the same size, a similar displacement current ID flows in each of the coupling capacitors. Because of the direction of this current, in the first current mirror 512 the P-channel device 520 develops an overdrive to supply this current. Devices 521 and 522 then mirror device 520 to supply current ID to nodes VL and VR. Because of this mirroring, the current ID demanded by the driver capacitors 510a,b is supplied by the mirror and does not need to be sourced from supply voltage VC through resistors RL and RR and thus, the displacement current does not create a common mode voltage movement in the nodes VL and VR. With fast movement of the high side voltage, the resulting common mode movement of nodes VL and VR (without cancelation scheme) can compromise the function of a follow on differential amplifier.

If a negative voltage ramp is experienced by the high side circuit 506 the displacement current ID flows in the opposite direction. In this case the N-channel device 531 accepts the displacement current ID from capacitor 518 and mirrors it to devices 532 and 533. These devices now accept the displacement current ID from the driver capacitors 510a,b and again these currents do not flow through resistors RL and RR, so as to suppress common mode movement.

Figure 6:
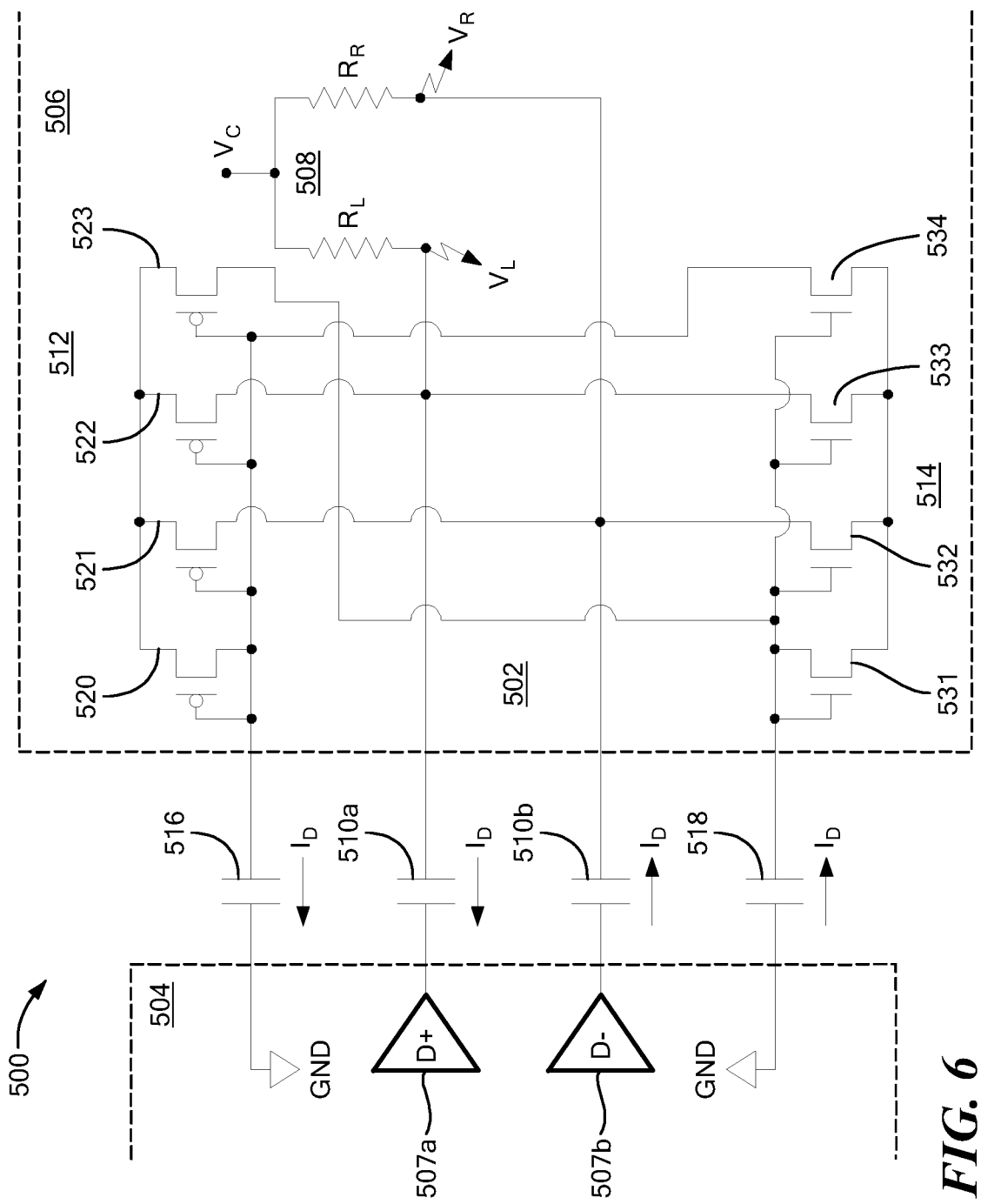
FIG. 6 is a schematic representation of a system having a differential capacitively isolated communication channel having common mode noise suppression.

FIG. 6 shows the embodiment 500 of FIG. 5 with the addition of a MOSFET 523 in the first current mirror 512 and a MOSFET 534 in the second mirror 514. The additional MOSFET 523 is to supply current demanded by coupling capacitor 518 during a positive ramp of the second system 506, which can comprise the circuit. This allows the drain node of device 531 to maintain its voltage during common mode events. If this device 523 is not included, it can delay the response of the N-channel mirrors when needed for the negative ramp. It can take nanoseconds to change from a below ground starting point. Similarly, the N-channel device 534 supplies current to the drain of device 520 keeping it within the voltage supply rails and speeds up response when needed.

Figure 7:
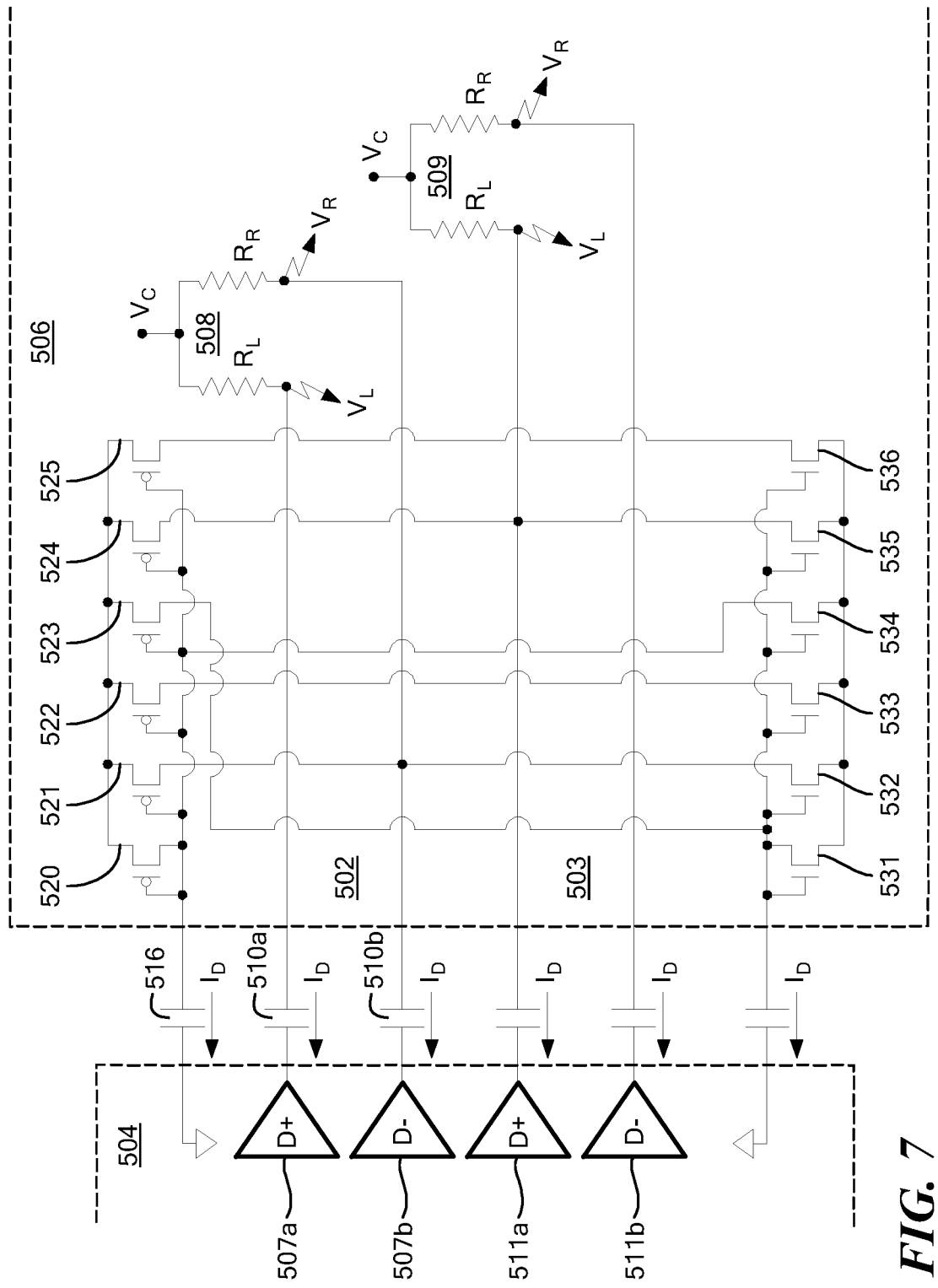
FIG. 7 is a schematic representation of a system having differential capacitively isolated communication channels having common mode noise suppression.

FIG. 7 shows the embodiment of FIG. 6 with the addition of another data channel 503. In addition to drivers 511a,b and resistor network 509, current mirror pairs 524, 525 and 535, 536 are also added.

It should be noted that in the example configuration the structure of the matching of devices 521, 522, 532, 533, 524, 525 and 535, 536 is a factor for proper operation. During fabrication, for example, device matching can be achieved by pumping DC current through the diode connected devices 520 and 531 and then trimming the matched pairs until they are equal. Trimming may also be achieved by diverting the current from the pairs to off-chip matched resistors and trimming until the voltages match.

Figure 8:
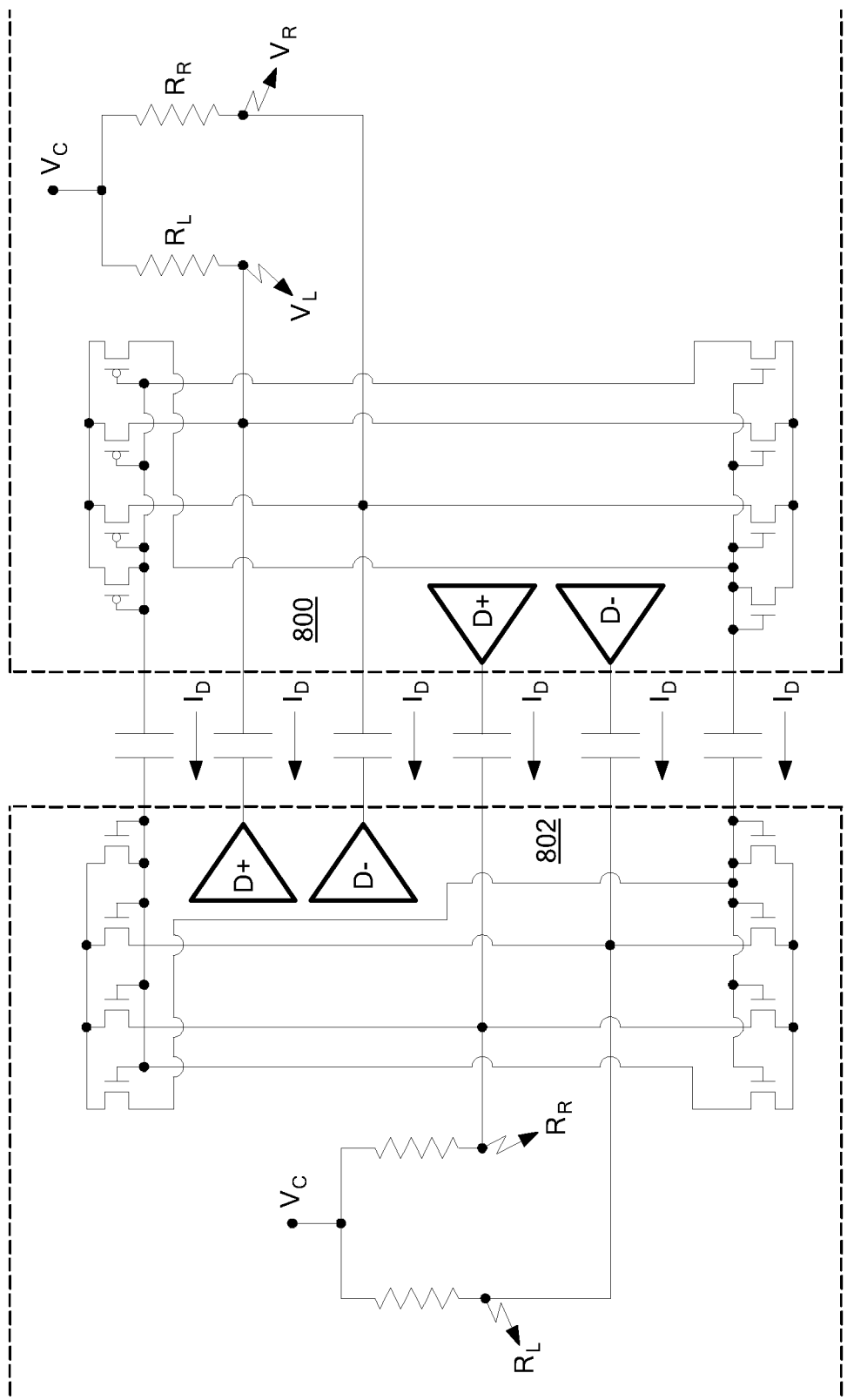
FIG. 8 is a schematic representation of a system having bidirectional differential capacitively isolated communication channels having common mode noise suppression.

FIG. 8 shows an example system with bidirectional communication channels 800, 802 having common mode noise suppression.

In embodiments, coupling capacitors can be matched to each other within some defined amount so that displacement currents are equal in the systems. In other embodiments, devices, such as devices 520, 522 can be trimmed to compensate for mismatched coupling capacitors.

Example isolator embodiments having common mode noise suppression with current mirrors, for example, may provide a 20× reduction in common mode movement produced by the common mode current that occurs due to a low side to high side common mode voltage movement over conventional configurations. This allows the communications channels to work in the presence of large low-to high side common mode voltage transients.

Example signal isolator configurations and applications are shown and described in U.S. Pat. Nos. 9,998,301, and 10,074,939 and 10,074,713 and 10,236,932 and 11,115,244 and 11,342,288, all of which are incorporated herein by reference.

Processing described above may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

What is claimed is:

1. A system, comprising:
   a capacitively isolated differential first communication channel connecting first and second circuits via first and second capacitors;
   a first driver to transmit a positive data signal of a differential signal and a second driver to transmit a negative data signal of the differential signal from the first circuit on the first communication channel to a receiver on the second circuit via the first and second capacitors, wherein the first driver has a first path to ground via a third capacitor and the second driver has a second path to ground via a fourth capacitor, wherein the receiver comprises a resistor network having a first terminal coupled to the first capacitor and a second terminal coupled to the second capacitor; and
   a common mode suppression circuit on the second circuit, wherein the common mode suppression circuit comprises first and second current mirrors coupled to the first and second drivers,
   wherein the common mode suppression circuit is configured to detect a common mode movement signal due to a noise pulse to the second circuit on the input and generate a corresponding signal on the output to maintain a current level across the resistor network and suppress common mode movement in the second circuit in response to the noise pulse.

2. The system according to claim 1, wherein the first current mirror comprises p-channel devices and the second current mirror comprises n-channel devices.

3. The system according to claim 1, wherein the first current mirror is configured to mirror current through the third capacitor.

4. The system according to claim 3, wherein the second current mirror is configured to mirror current through the fourth capacitor.

5. The system according to claim 4, wherein the first and second current mirrors are configured to maintain current in the resistor network in response to common mode noise in the second circuit.

6. The system according to claim 5, wherein the first current mirror is coupled to the third capacitor, the first driver, the second driver, the second current mirror, and the resistor network.

7. A method, comprising:
employing a capacitively isolated differential first communication channel connecting first and second circuits via first and second capacitors;
employing a first driver to transmit a positive data signal of a differential signal and a second driver to transmit a negative data signal of the differential signal from the first circuit on the first communication channel to a receiver on the second circuit via the first and second capacitors, wherein the first driver has a first path to ground via a third capacitor and the second driver has a second path to ground via a fourth capacitor, wherein the receiver comprises a resistor network having a first terminal coupled to the first capacitor and a second terminal coupled to the second capacitor; and
employing a common mode suppression circuit on the second circuit, wherein the common mode suppression circuit comprises first and second current mirrors coupled to the first and second drivers,
wherein the common mode suppression circuit is configured to detect a common mode movement signal due to a noise pulse to the second circuit on the input and generate a corresponding signal on the output to maintain a current level across the resistor network and suppress common mode movement in the second circuit in response to the noise pulse.

8. The method according to claim 7, wherein the first current mirror comprises p-channel devices and the second current mirror comprises n-channel devices.

9. The method according to claim 7, wherein the first current mirror is configured to mirror current through the third capacitor.

10. The method according to claim 9, wherein the second current mirror is configured to mirror current through the fourth capacitor.

11. The method according to claim 10, wherein the first and second current mirrors are configured to maintain current in the resistor network in response to common mode noise in the second circuit.

12. The method according to claim 11, wherein the first current mirror is coupled to the third capacitor, the first driver, the second driver, the second current mirror, and the resistor network.

* * * * *